US012567871B2

(12) United States Patent
Chang et al.

(10) Patent No.: US 12,567,871 B2
(45) Date of Patent: Mar. 3, 2026

(54) CODING APPARATUS AND CODING METHOD

(71) Applicant: Novatek Microelectronics Corp., Hsinchu (TW)

(72) Inventors: Cheng-Yang Chang, Hsinchu City (TW); Chieh-Fang Teng, Taoyuan City (TW); Yu Shan Tai, Taoyuan City (TW); Kai-Ya Wei, Hsinchu City (TW); An-Yu Wu, Taipei City (TW); Yen-Hsi Lee, Taipei City (TW)

(73) Assignee: Novatek Microelectronics Corp., Hsinchu (TW)

( * ) Notice: Subject to any disclaimer, the term of this patent is extended or adjusted under 35 U.S.C. 154(b) by 307 days.

(21) Appl. No.: 18/344,859

(22) Filed: Jun. 30, 2023

(65) Prior Publication Data
US 2025/0007534 A1 Jan. 2, 2025

(51) Int. Cl.
*H03M 7/00* (2006.01)
*H03M 7/30* (2006.01)

(52) U.S. Cl.
CPC ....... *H03M 7/3066* (2013.01); *H03M 7/3059* (2013.01)

(58) Field of Classification Search
CPC . H03M 7/3066; H03M 7/3059; H03M 7/6029
See application file for complete search history.

(56) References Cited

U.S. PATENT DOCUMENTS

2019/0019128 A1* 1/2019 Fox, Jr. ............ G06Q 10/06313
2019/0279095 A1* 9/2019 Guntoro ................. G06N 3/045

FOREIGN PATENT DOCUMENTS

WO WO-2021050007 A1 * 3/2021 ............. G06V 20/46

* cited by examiner

*Primary Examiner* — Jean B Jeanglaude
(74) *Attorney, Agent, or Firm* — JCIPRNET

(57) ABSTRACT
A coding apparatus and a coding method are proposed. The coding apparatus includes a memory and a processor. The processor is configured to obtain a feature map, perform lossy compression on the feature map to generate a lossy feature map, perform lossless compression on the lossy feature map to generate a resultant feature map, and store the resultant feature map in the memory.

20 Claims, 5 Drawing Sheets

Obtain a feature map — S202

Perform lossy compression on the feature map to generate a lossy feature map — S204

Perform lossless compression on the lossy feature map to generate a resultant feature map — S206

Store the resultant feature map in the memory — S208

510

CODING APPARATUS AND CODING METHOD

TECHNICAL FIELD

The disclosure relates to a coding apparatus and a coding method.

BACKGROUND

Deep learning networks have been presenting outstanding performance in a variety of applications. However, the implementations are computationally and memory intensive due to the complexity of neural networks. One of the main bottleneck issues comes from feature maps generated between layers and residing in the memory.

SUMMARY OF THE DISCLOSURE

To solve the prominent issue, a coding apparatus and a coding method are proposed.

According to one of the exemplary embodiments, the coding apparatus includes a memory and a processor. The processor is configured to obtain a feature map, perform lossy compression on the feature map to generate a lossy feature map, perform lossless compression on the lossy feature map to generate a resultant feature map, and store the resultant feature map in the memory.

According to one of the exemplary embodiments, the coding method includes obtaining a feature map, performing lossy compression on the feature map to generate a lossy feature map, performing lossless compression on the lossy feature map to generate a resultant feature map, and storing the resultant feature map in a memory.

It should be understood, however, that this summary may not contain all of the aspect and embodiments of the disclosure and is therefore not meant to be limiting or restrictive in any manner. Also, the disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

Figure 1:
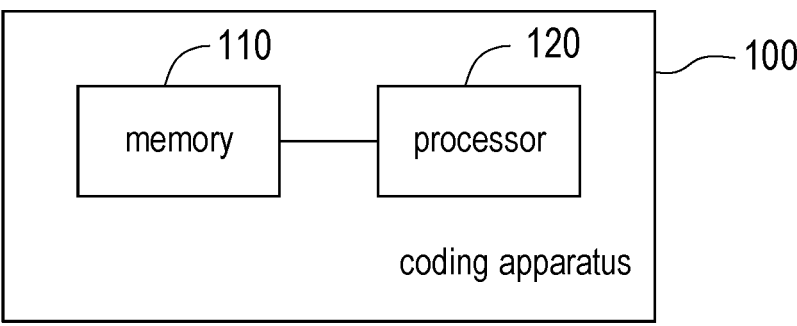
FIG. 1 illustrates a schematic diagram of a coding apparatus in accordance with an exemplary embodiment of the disclosure.

To make the above features and advantages of the application more comprehensible, several embodiments accompanied with drawings are described in detail as follows.

DESCRIPTION OF THE EMBODIMENTS

Some embodiments of the disclosure will now be described more fully hereinafter with reference to the accompanying drawings, in which some, but not all embodiments of the application are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

FIG. 1 illustrates a schematic diagram of a coding apparatus in accordance with an exemplary embodiment of the disclosure. All components and configurations of the apparatus are first introduced in FIG. 1. The functionalities of the components are disclosed in more detail in conjunction with FIG. 2.

Referring to FIG. 1, a coding apparatus 100 at least includes a memory 110 and a processor 120. The coding apparatus 100 may be an electronic system or a computer system. The memory may be many forms of random-access memory (RAM) such as a dynamic random-access memory (DRAM). The processor 120 may be may be one or more of a North Bridge, a South Bridge, a field programmable array (FPGA), a programmable logic device (PLD), an application specific integrated circuit (ASIC), other similar devices, or a combination thereof. The processor may also be a central processing unit (CPU), a programmable general purpose or special purpose microprocessor, a digital signal processor (DSP), a graphics processing unit (GPU), other similar devices, or a combination thereof.

Figure 2:
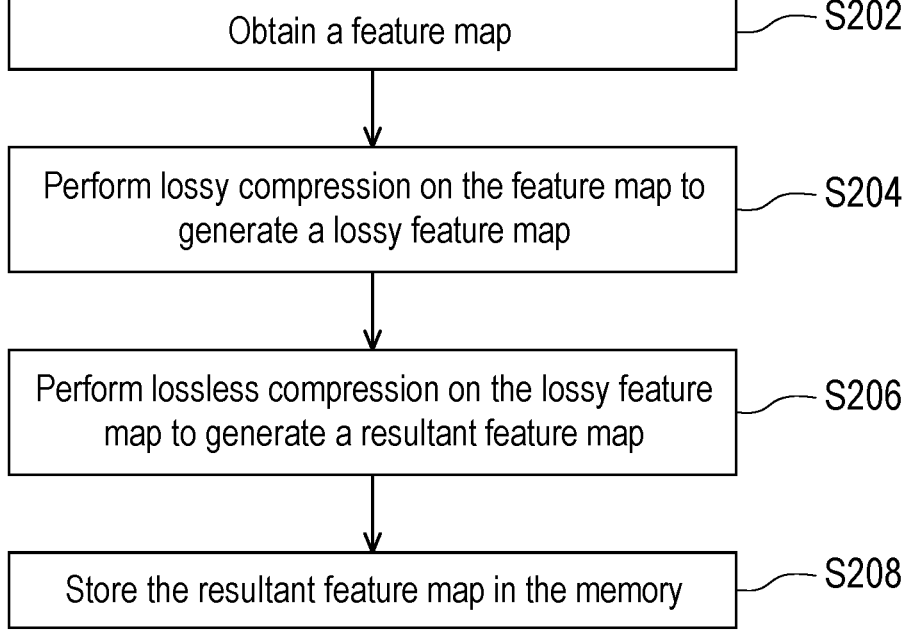
FIG. 2 illustrates a flowchart of a coding method in accordance with an exemplary embodiment of the disclosure.

FIG. 2 illustrates a flowchart of a coding method in accordance with an exemplary embodiment of the disclosure, where the steps of FIG. 2 could be implemented by the coding apparatus 100 as illustrated in FIG. 1.

Referring to FIG. 2 in conjunction with FIG. 1, the processor 120 of the coding apparatus 100 obtains a feature map (Step S202). Herein, the feature map may be an output of a given layer of a neural network and represented as an array of numerical values. Next, the processor 120 performs lossy compression on the feature map to generate a lossy feature map (Step S204) and performs lossless compression on the feature map to generate a resultant feature map (Step S206). Lossy compression is used to compress a file by discarding unnecessary or less important information and may be implemented by leveraging, for example, K-lossy compression to be introduced later on, sparsity-aware quantization (SPARQ), or transformed-based lossy compression in JPEG for ACTivations (JPEGACT). Lossless compression is used to compress a file using statistical redundancy to represent data without losing any information and may be implemented by leveraging, for example, zero value compression, block compression, run-length encoding, compressed sparse row (CSR), bit-plain slicing, or Golomb coding. The processor 120 stores the resultant feature map in the memory 110 (Step S208), where the resultant feature map residing in the memory 110 may be used for a subsequent layer of the neural network.

Figure 3:
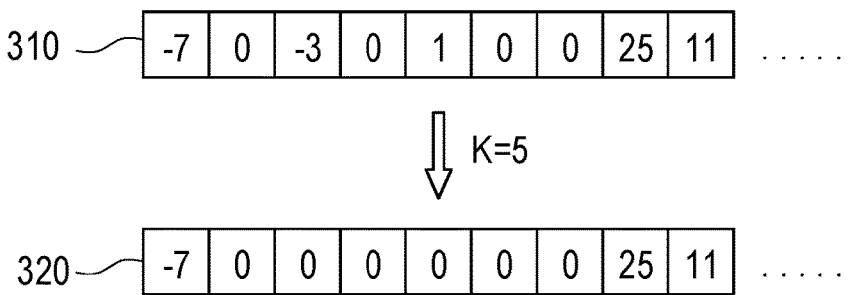
FIG. 3 illustrates a schematic diagram of lossy compression in accordance with one of the exemplary embodiments of the disclosure.

For better comprehension, FIG. 3 illustrates a schematic diagram of lossy compression in accordance with one of the exemplary embodiments of the disclosure. The following scheme is also referred to as "K-lossy compression" hereafter.

Referring to FIG. 3 in conjunction with FIG. 1, a feature map 310 includes multiple input values (referred to as "first input values" hereafter). The processor 120 compares each of the first input values in the feature map 310 with a first predetermined threshold K so as to generate a lossy feature map 320 including multiple output values (referred to as "first output values" hereafter).

In detail, the processor 120 may generate the lossy feature map 320 according to Eq. (1):

$$OUT(x) = \begin{cases} 0, & \text{if abs(IN}(x)) < K \\ IN(x), & \text{if abs(IN}(x)) \geq K \end{cases} \qquad \text{Eq. (1)}$$

Herein, IN(x) denotes a value at position x of a feature map, and OUT(x) denotes a value at position x of a lossy feature map. In other words, when the magnitude of a first input value is less than the predetermined threshold K, the processor 120 sets a corresponding first output value as zero. When the magnitude of a first input value is not less than the predetermined threshold K, the processor 120 sets a corresponding first output value as the first input value.

For example, assume that K=5. For the first input values 0, −3, and 1 in the feature map 310, the corresponding first output values in the lossy feature map 320 would be all set as 0. For the first input values −7, 25, and 11 in the feature map 310, the corresponding first output values in the lossy feature map 320 would remain to be the same as the first input values (i.e. −7, 25, and 11). It is also noted that, if K=0, it is equivalent to say that the lossy compression is bypassed.

Once the lossy feature map 320 is generated, the processor 120 performs lossless compression thereon. In one exemplary embodiment, the processor 120 may perform zero-value compression on the lossy feature map 320 to accordingly generate a resultant feature map to be stored in the memory 110. In another exemplary embodiment, the processor 120 may perform zero-value compression on the lossy feature map 320 to generate an intermediate feature map and perform block compression on the intermediate feature map to generate a resultant feature map as demonstrated hereafter.

Figure 4:
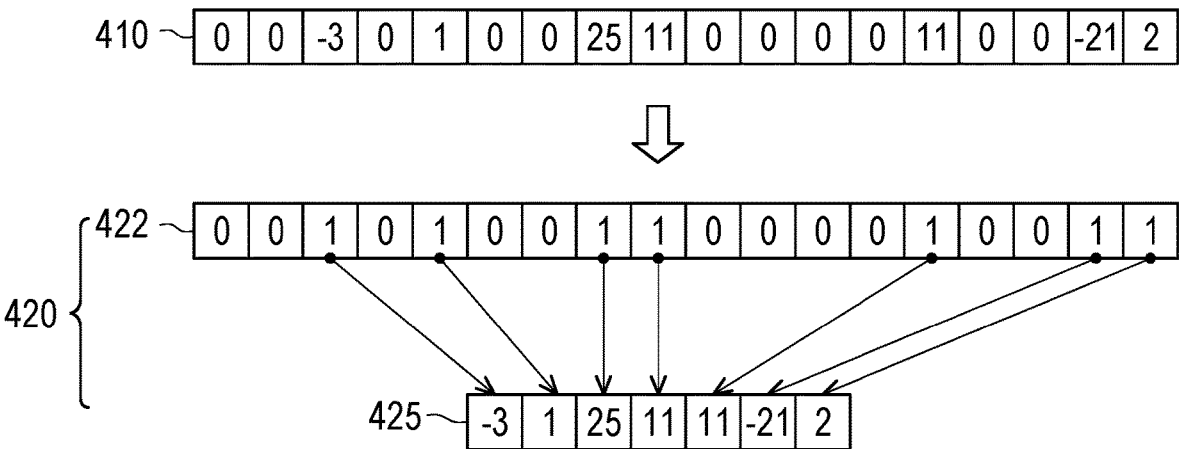
FIG. 4 illustrates a schematic diagram of lossless compression in accordance with one of the exemplary embodiments of the disclosure.

FIG. 4 illustrates a schematic diagram of lossless compression in accordance with one of the exemplary embodiments of the disclosure. The following scheme is also known as "zero value compression" that deals with data containing significant zero-valued sparsity.

Referring to FIG. 4 in conjunction with FIG. 1, a lossy feature map 410 includes multiple input values (referred to as "second input values" hereafter). The processor 120 determines whether each of the second input values in the lossy feature map 410 is zero to generate a binary map 422 along with a non-zero value set 425 that stores non-zero second input values, and thereby generating an intermediate feature map 420.

In detail, the processor 120 may generate the binary map 420 and the non-zero value set 425 respectively according to Eq. (2) and Eq. (3)

$$BM(x) = \begin{cases} 0, & \text{if IN}(x) = 0 \\ 1, & \text{if IN}(x) \neq 0 \end{cases} \qquad \text{Eq. (2)}$$

$$NZV(z) = IN(x), \text{ if } IN(x) \neq 0 \qquad \text{Eq. (3)}$$

Herein, IN(x) denotes a value at position x of a lossy feature map, and BM(x) denotes a binary value at position x of a binary map, and NZV(z) denotes a value at position z of a non-zero value set. Note that if IN(x) is a non-zero value, NZV(z) is set to IN(x) and the value of z is increased by 1. When a second input value is zero, the processor 120 sets a corresponding binary value as zero. When a second input value is not zero, the processor 120 sets a corresponding binary value as one and stores the second input value into the non-zero value set.

For example, the second input values −3, 11, 25, 11, 11, −21, and 2 in the lossy feature map 410 are stored in the non-zero value set 425 and the corresponding binary values are set as one in the binary map 422. The processor 120 may generate the intermediate feature map 420 by packing the non-zero value set 425 along with the binary map 422 indicating actual positions of non-zeros in the lossy feature map 410.

Figure 5:
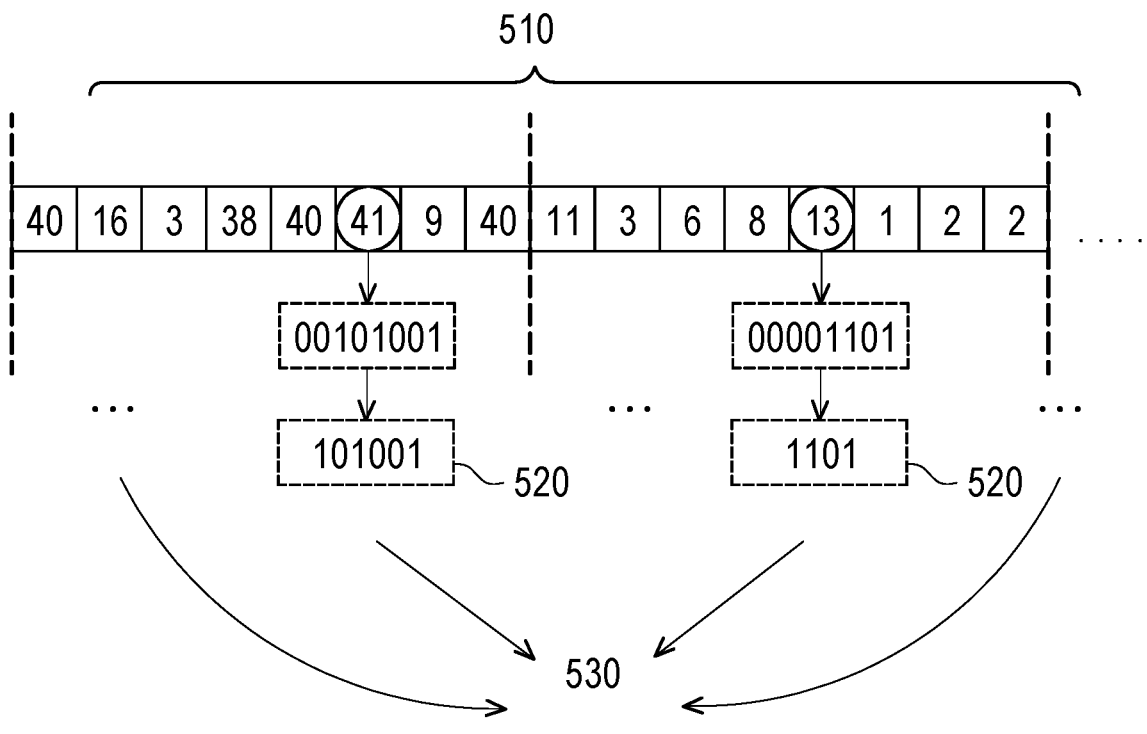
FIG. 5 illustrates a schematic diagram of lossless compression in accordance with one of the exemplary embodiments of the disclosure.

FIG. 5 illustrates a schematic diagram of lossless compression in accordance with one of the exemplary embodiments of the disclosure. The following scheme is also known as "block compression" that deals with unused bit data.

Referring to FIG. 5 in conjunction with FIG. 1, an intermediate feature map 510 includes multiple blocks, and each of the blocks includes multiple input values (referred to as "third input values" hereafter), where the size of each block is predetermined and consistent. The processor 120 determines a maximum value of the third input values in each block for bit reduction so as to generate output values (referred to as "third output values") 520 for each block, and thereby generating a resultant feature map 530.

In detail, the processor 120 may determine a maximum bit usage of a current block according to Eq. (4):

$$R = \max_{x \in [0, B-1]} \text{ceil}\,(\log 2(IN(x))) \qquad \text{Eq. (4)}$$

Herein, IN(x) denotes a value at position x of the current block with size B, and R denotes a maximum bit usage corresponding to a maximum value in the current block. That is, a maximum value of third input values in the current block is determined so as to determine a maximum bit usage corresponding to the maximum value, and a bit usage of each of the third input values of the current block is reduced according to the maximum bit usage to generate a corresponding third output value. In other words, the bit usage for each third output value within the same block would be the same.

For example, a maximum value of the third values 40, 16, 3, 38, 40, 41, 9, 40 in a first block is 41, a maximum bit usage of the first block becomes R=ceil(log 2(41))=6. In other words, all the third output values in the first block are represented in 6 bits (e.g. the third value 41 can be represented as 101001), and the bit usage of each third output value of the first block is reduced from 8 bits to 6 bits. With a similar fashion, all the third output values in the second block are represented in 4 bits (e.g. the third value 13 can be represented as 1101), and the bit usage of each third output value of the second block is reduced from 8 bits to 4 bits.

The processor 120 may generate the resultant feature map 530 by packing the third output values 520 of each all the blocks and store the resultant feature map 530 in the memory 120 for future use.

Figure 6:
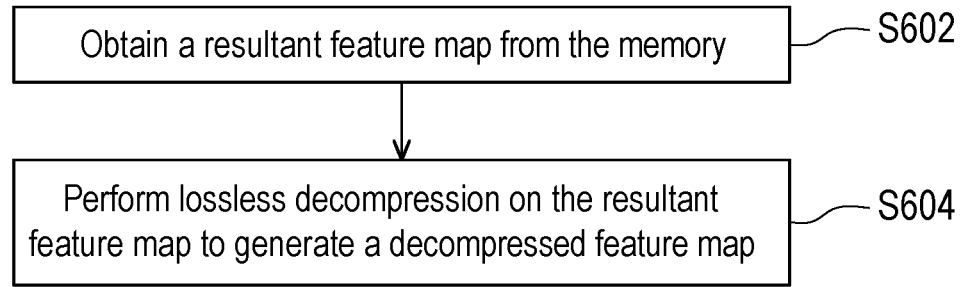
FIG. 6 illustrates a flowchart of a decoding method in accordance with an exemplary embodiment of the disclosure.

FIG. 6 illustrates a flowchart of a decoding method in accordance with an exemplary embodiment of the disclosure, where the steps of FIG. 6 could be implemented by the apparatus as illustrated in FIG. 1. In the present exemplary embodiment, FIG. 6 may be considered as a continuation of the steps in FIG. 2.

Referring to FIG. 6 in conjunction with FIG. 1, the processor 120 of the coding apparatus 100 obtains a resultant feature map from the memory 110 (Step S602) and performs lossless decompression on the resultant feature map to generate a decompressed feature map (Step S604). Decompression is the conversion of a compressed format (e.g. the resultant feature map residing in the memory 110) back into the original format (e.g. the original feature map). However, since lossy compression was performed on the original feature map in the compression stage in the present exemplary embodiment, unnecessary or less important information has been irreversibly removed, and the amount of information loss can be tolerated. The decompressed feature map reconstructed by lossless decompression techniques is adequate for most applications.

In the present exemplary embodiment, assume that the resultant feature map is generated by performing zero-value compression and block compression as respectively illustrated in FIG. 4 and FIG. 5. Therefore, block decompression as well as zero-value decompression are both performed.

The resultant feature map includes multiple block, and each block includes third output values. The processor 120 performs block decompression on the resultant feature map according to the maximum bit usage of each of the blocks to generate the intermediate feature map so that all the third output values in the resultant feature map are decompressed to their original bit lengths. The intermediate feature map includes a non-zero value set and a binary map having multiple one values and multiple zero values. Next, the processor 120 performs zero-value decompression on the intermediate feature map to generate the decompressed feature map.

Figure 7:
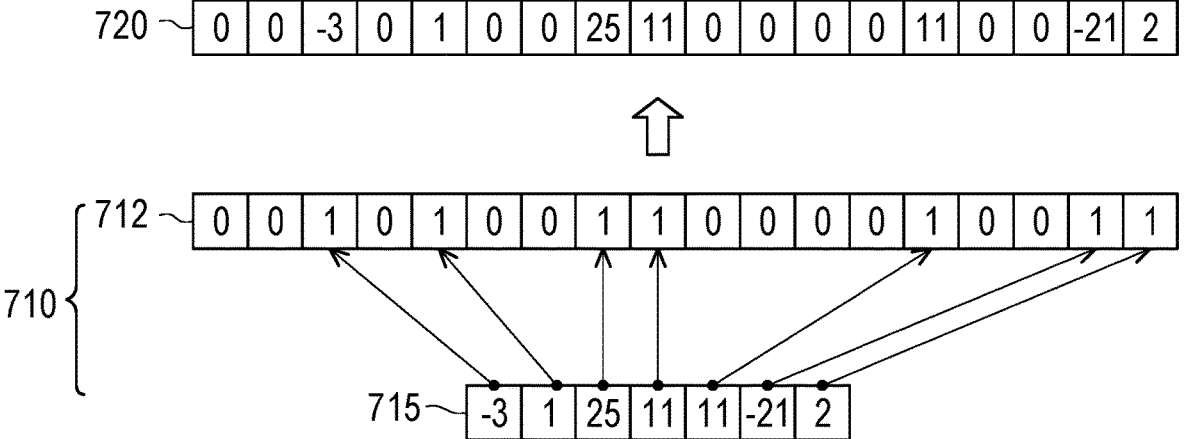
FIG. 7 illustrates a schematic diagram of zero value decompression in accordance with one of the exemplary embodiments of the disclosure.

For better understanding, FIG. 7 illustrates a schematic diagram of zero value decompression in accordance with one of the exemplary embodiments of the disclosure.

Referring to FIG. 7 in conjunction with FIG. 1, the processor 120 may generate a decompressed feature map 720 by using the binary map 712 and the non-zero value set 715 included in an intermediate feature map 710. In detail, the processor 120 may generate the decompressed feature map 720 according to Eq. (5):

$$\mathrm{OUT}(x) = \begin{cases} 0, & \text{if } BM(x) = 0 \\ NZV(z), & \text{if } BM(x) = 1 \end{cases} \qquad \text{Eq. (5)}$$

Herein, OUT(x) denotes a value at position x of a decompressed feature map, and BM(x) denotes a binary value at position x of a binary map, and NZV(z) denotes a value at position z of a non-zero value set. Note that if BM(x) is a non-zero value, OUT(x) is set to NZV(z) and the value of z is increased by 1. When a binary value is zero, the processor 120 sets a corresponding output value as zero. When a binary value is one, the processor 120 sets a corresponding output value as the value in the non-zero value set.

Figure 8:
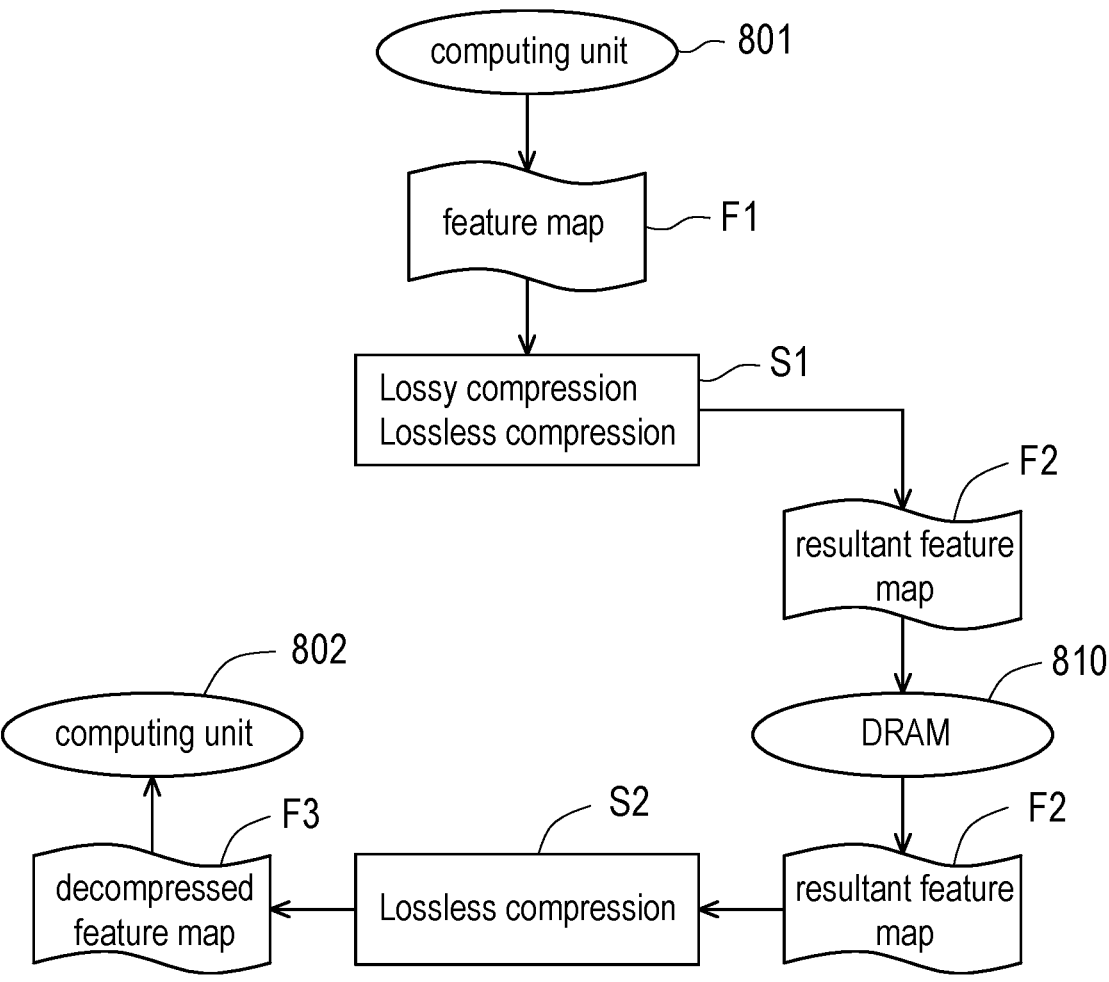
FIG. 8 illustrates a functional block diagram of a coding method including both compression and decompression processes in accordance with one of the exemplary embodiments of the disclosure.

FIG. 8 illustrates a functional block diagram of a coding method including both compression and decompression processes in accordance with one of the exemplary embodiments of the disclosure.

Referring to FIG. 8, a current computing unit 801 outputs a feature map F1. Next, lossy compression and lossless compression are performed on the feature map F1 to generate a resultant feature map F2, and the resultant feature map F2 is stored in an external storage device such as a DRAM 810. Before a next computing unit 802 starts computing, the resultant feature map F2 is obtained from the DRAM 810. Next, lossless decompression is performed on the resultant feature map F2 to obtain a decompressed feature map F3, and the decompressed feature map F3 is inputted to the next computing unit 802.

In view of the aforementioned descriptions, lossy compression and lossless compression are performed on a feature map in particular neural network architecture to reduce the memory burden with minimal performance degradation.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A coding apparatus comprising:
   a memory; and
   a processor, configured to:
      obtain a feature map;
      perform lossy compression on the feature map to generate a lossy feature map;
      perform lossless compression on the lossy feature map to generate a resultant feature map; and
      store the resultant feature map in the memory.

2. The coding apparatus according to claim 1, wherein the feature map comprises a plurality of first input values, and wherein in the lossy compression, the processor is configured to:
   receive a first predetermined threshold;
   for each of the plurality of first input values:
      compare the first input value and the first predetermined threshold;
      in response to a magnitude of the first input value being less than the first predetermined threshold, set a first output value corresponding to the first input value as zero; and
      in response to the magnitude of the first input value not being less than the first predetermined threshold, set the first output value corresponding to the first input value as the first input value; and generate the lossy feature map according to the plurality of first output value.

3. The coding apparatus according to claim 2, wherein in the lossless compression, the processor is configured to:

perform zero-value compression on the lossy feature map to accordingly generate the resultant feature map.

4. The coding apparatus according to claim 1, wherein in the lossless compression, the processor is configured to:

perform zero-value compression on the lossy feature map to generate an intermediate feature map; and perform block compression on the intermediate feature map to generate the resultant feature map.

5. The coding apparatus according to claim 4, wherein the lossy feature map comprises a plurality of second input values, and wherein in the lossless compression, the processor is configured to:

for each of the plurality of second input values:

determine whether the second input value is zero;

in response to the second input value being zero, set a binary value of a binary map corresponding to the second input value as zero; and in response to the second input value not being zero, set the binary value of the binary map corresponding to the second input value as one, and store the second input value into a non-zero value set; and generate the intermediate feature map according to the binary map and the non-zero value set.

6. The coding apparatus according to claim 4, wherein the intermediate feature map comprises a plurality of blocks, wherein each of the blocks comprises a plurality of third input values, and wherein in the lossless compression, the processor is configured to:

for each of the plurality of blocks:

determine a maximum value of the plurality of third input values in the block so as to determine a maximum bit usage corresponding to the maximum value; and reduce a bit usage of each of the plurality of third input values of the block according to the maximum bit usage to generate a corresponding third output value; and generate the resultant feature map according to each of the plurality of third output values of each of the plurality of blocks.

7. The coding apparatus according to claim 1, wherein the processor is further configured to:

obtain the resultant feature map from the memory; and perform lossless decompression on the resultant feature map to generate a decompressed feature map.

8. The coding apparatus according to claim 7, wherein the processor is configured to:

perform block decompression on the resultant feature map to generate an intermediate feature map; and perform zero-value decompression on the intermediate feature map to generate the decompressed feature map.

9. The coding apparatus according to claim 8, wherein the resultant feature map comprises a plurality of blocks, and wherein the processor is configured to:

generate the intermediate feature map according to the resultant feature map and a maximum bit usage of each of the blocks.

10. The coding apparatus according to claim 8, wherein the intermediate feature map comprises a non-zero value set and a binary map having a plurality of one values and a plurality of zero values, and wherein the processor is configured to:

generate the decompressed feature map according to the intermediate feature map and the non-zero value set.

11. A coding method comprising:

obtaining a feature map;

performing lossy compression on the feature map to generate a lossy feature map;

performing lossless compression on the lossy feature map to generate a resultant feature map; and storing the resultant feature map in a memory.

12. The coding method according to claim 11, wherein the feature map comprises a plurality of first input values, and wherein the step of performing the lossy compression on the feature map to generate the lossy feature map comprises:

receiving a first predetermined threshold;

for each of the plurality of first input values:

comparing the first input value and the first predetermined threshold;

in response to a magnitude of the first input value being less than the first predetermined threshold, setting a first output value corresponding to the first input value as zero; and in response to the magnitude of the first input value not being less than the first predetermined threshold, setting the first output value corresponding to the first input value as the first input value; and generating the lossy feature map according to the plurality of first output value.

13. The coding method according to claim 12, wherein the step of performing the lossless compression on the lossy feature map to generate the resultant feature map comprises:

performing zero-value compression on the lossy feature map to accordingly generate the resultant feature map.

14. The coding method according to claim 11, wherein the step of performing the lossless compression on the lossy feature map to generate the resultant feature map comprises:

performing zero-value compression on the lossy feature map to generate an intermediate feature map; and performing block compression on the intermediate feature map to generate the resultant feature map.

15. The coding method according to claim 14, wherein the lossy feature map comprises a plurality of second input values, and wherein the step of performing the lossless compression on the lossy feature map to generate the resultant feature map comprises:

for each of the plurality of second input values:

determining whether the second input value is zero;

in response to the second input value being zero, setting a binary value of a binary map corresponding to the second input value as zero; and in response to the second input value not being zero, setting the binary value of the binary map corresponding to the second input value as one, and storing the second input value into a non-zero value set; and generating the intermediate feature map according to the binary map and the non-zero value set.

16. The coding method according to claim 14, wherein the intermediate feature map comprises a plurality of blocks, wherein each of the blocks comprises a plurality of third input values, and wherein the step of performing the lossless compression on the lossy feature map to generate the resultant feature map comprises:

for each of the plurality of blocks:

determining a maximum value of the plurality of third input values in the block so as to determine a maximum bit usage corresponding to the maximum value; and reducing a bit usage of each of the plurality of third input values of the block according to the maximum bit usage to generate a corresponding third output value; and generating the resultant feature map according to each of the plurality of third output values of each of the plurality of blocks.

17. The coding method according to claim 11 further comprising:

obtaining the resultant feature map from the memory; and performing lossless decompression on the resultant feature map to generate a decompressed feature map.

18. The coding method according to claim 17, wherein the step of performing the lossless decompression on the resultant feature map to generate the decompressed feature map comprises:

performing block decompression on the resultant feature map to generate an intermediate feature map; and performing zero-value decompression on the intermediate feature map to generate the decompressed feature map.

19. The coding method according to claim 18, wherein the resultant feature map comprises a plurality of blocks, and wherein the step of performing block decompression on the resultant feature map to generate the intermediate feature map comprises:

generate the intermediate feature map according to the resultant feature map and a maximum bit usage of each of the blocks.

20. The coding method according to claim 18, wherein the intermediate feature map comprises a non-zero value set and a binary map having a plurality of one values and a plurality of zero values, and wherein the step of performing zero-value decompression on the intermediate feature map to generate the decompressed feature map comprises:

generating the decompressed feature map according to the intermediate feature amp and the non-zero value set.

\* \* \* \* \*